US012619271B2

(12) United States Patent
Palit et al.

(10) Patent No.: US 12,619,271 B2
(45) Date of Patent: May 5, 2026

(54) DEVICES AND METHODS TO CONTROL DYNAMIC AUDIO RANGE IN BOOSTED AUDIO SYSTEMS

(71) Applicant: TEXAS INSTRUMENTS INCORPORATED, Dallas, TX (US)

(72) Inventors: Supriyo Palit, Kolkata (IN); Mohit Chawla, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/340,506

(22) Filed: Jun. 7, 2021

(65) Prior Publication Data

US 2022/0229457 A1     Jul. 21, 2022

(30) Foreign Application Priority Data

Jan. 20, 2021    (IN) ............................. 202141002839

(51) Int. Cl.
G05F 1/625        (2006.01)
H03G 3/30        (2006.01)
(Continued)

(52) U.S. Cl.
CPC ........... G05F 1/625 (2013.01); H03G 3/3005 (2013.01); H04R 3/04 (2013.01); H04R 29/001 (2013.01);
(Continued)

(58) Field of Classification Search
CPC ...... G05F 1/625; H03G 3/3005; H03G 11/00; H04R 3/04; H04R 29/001; H04R 2430/01; H04R 3/002; H04R 3/00; H04R 3/02; H04R 2499/13; H04S 1/007; H04S 2400/13; H04S 7/30; G10K 11/16; G10K 9/12; G10K 11/24
(Continued)

(56) References Cited

U.S. PATENT DOCUMENTS 4,873,493 A * 10/1989 Fujiwara ............... H03F 1/0244
330/285
4,912,393 A * 3/1990 Anderson ............ H03G 11/002
327/542
(Continued)

*Primary Examiner* — Xu Mei
(74) *Attorney, Agent, or Firm* — Xianghui Huang; Frank D. Cimino

(57) ABSTRACT

A controller regulates the voltage delivered to the load and current drawn from the battery in an audio system depending on ripple in the battery voltage which is input to the controller to allocate power for audio playback. Regulation maximizes available headroom while avoiding audio clipping. The effect of internal battery and external parasitic resistance (ESR) on ripple is compensated by an iterative process. ESR is rapidly increased whenever the minimum of the battery voltage input to the controller falls below a clipping threshold and slowly decreased whenever such voltage exceeds such threshold and the audio is under compression. A limiter allocates power to utilize more of the available audio headroom. A de-emphasis filter in each audio signal path compensates for capacitive ripple in the battery voltage input to the controller. As the frequency of the audio input changes, the filter(s) allow frequency-dependent power/current regulation to fill the full audio range without distortion.

18 Claims, 8 Drawing Sheets

(51) Int. Cl.
    *H04R 3/04*           (2006.01)
    *H04R 29/00*        (2006.01)
    *H04S 1/00*           (2006.01)

(52) U.S. Cl.
    CPC .......... *H04S 1/007* (2013.01); *H04R 2430/01*
               (2013.01); *H04S 2400/13* (2013.01)

(58) Field of Classification Search
    USPC ......................... 381/106, 111, 116, 120, 121
    See application file for complete search history.

(56) References Cited

U.S. PATENT DOCUMENTS

| | | | |
|---|---|---|---|
| 10,212,514 B2 * | 2/2019 | Serwy ..................... | H03F 3/183 |
| 2007/0140513 A1 * | 6/2007 | Furge ..................... | H03G 3/007 |
| | | | 381/120 |
| 2013/0089223 A1 * | 4/2013 | Heineman ............... | H03F 3/185 |
| | | | 381/120 |
| 2016/0126899 A1 * | 5/2016 | Doy .......................... | H03F 3/68 |
| | | | 330/297 |

* cited by examiner

600

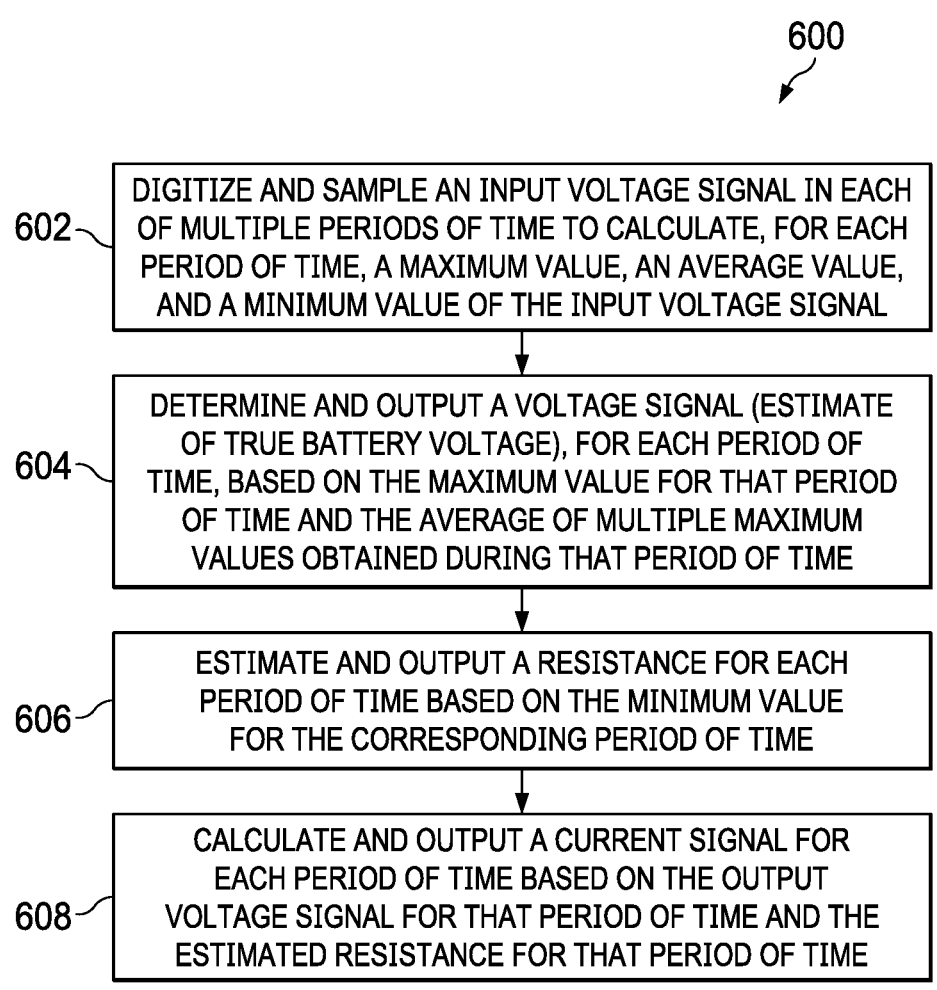

602 — DIGITIZE AND SAMPLE AN INPUT VOLTAGE SIGNAL IN EACH OF MULTIPLE PERIODS OF TIME TO CALCULATE, FOR EACH PERIOD OF TIME, A MAXIMUM VALUE, AN AVERAGE VALUE, AND A MINIMUM VALUE OF THE INPUT VOLTAGE SIGNAL

604 — DETERMINE AND OUTPUT A VOLTAGE SIGNAL (ESTIMATE OF TRUE BATTERY VOLTAGE), FOR EACH PERIOD OF TIME, BASED ON THE MAXIMUM VALUE FOR THAT PERIOD OF TIME AND THE AVERAGE OF MULTIPLE MAXIMUM VALUES OBTAINED DURING THAT PERIOD OF TIME

606 — ESTIMATE AND OUTPUT A RESISTANCE FOR EACH PERIOD OF TIME BASED ON THE MINIMUM VALUE FOR THE CORRESPONDING PERIOD OF TIME

608 — CALCULATE AND OUTPUT A CURRENT SIGNAL FOR EACH PERIOD OF TIME BASED ON THE OUTPUT VOLTAGE SIGNAL FOR THAT PERIOD OF TIME AND THE ESTIMATED RESISTANCE FOR THAT PERIOD OF TIME

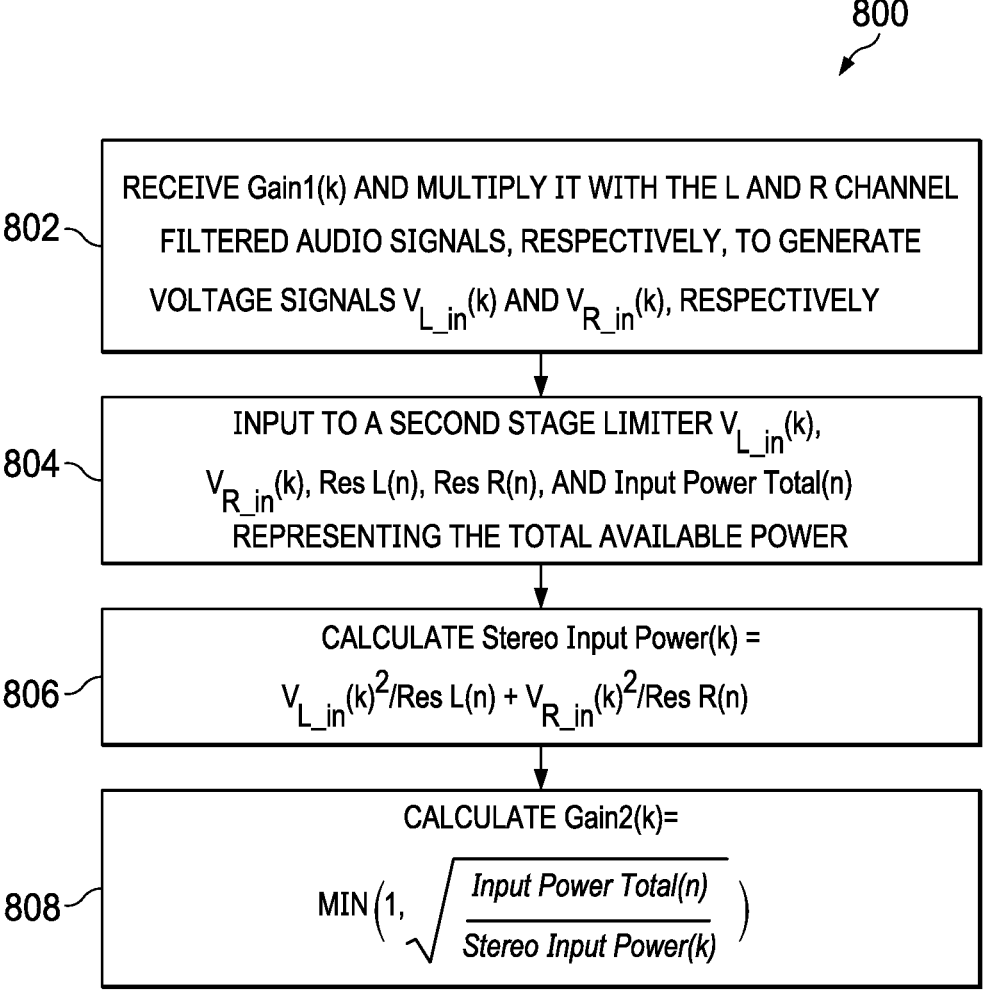

802 — RECEIVE Gain1(k) AND MULTIPLY IT WITH THE L AND R CHANNEL FILTERED AUDIO SIGNALS, RESPECTIVELY, TO GENERATE VOLTAGE SIGNALS $V_{L\_in}(k)$ AND $V_{R\_in}(k)$, RESPECTIVELY 804 — INPUT TO A SECOND STAGE LIMITER $V_{L\_in}(k)$, $V_{R\_in}(k)$, Res L(n), Res R(n), AND Input Power Total(n) REPRESENTING THE TOTAL AVAILABLE POWER 806 — CALCULATE Stereo Input Power(k) = $V_{L\_in}(k)^2$/Res L(n) + $V_{R\_in}(k)^2$/Res R(n)

808 — CALCULATE Gain2(k)= $\mathrm{MIN}\left(1, \sqrt{\dfrac{Input\ Power\ Total(n)}{Stereo\ Input\ Power(k)}}\right)$

FIG. 8

DEVICES AND METHODS TO CONTROL DYNAMIC AUDIO RANGE IN BOOSTED AUDIO SYSTEMS

FIELD OF DISCLOSURE

This disclosure relates generally to devices and methods that control and improve dynamic audio range in boosted audio systems, and more particularly to devices and methods that enable full use of the available audio range while limiting clipping, and that enable battery current regulation and preserve battery life.

BACKGROUND

A boosted audio playback system provides an amplified output voltage via a boost circuit to drive speakers. The voltage input to the boost circuit is provided by the power supply, e.g., battery, of the system. The voltage at the input of the boost circuit typically suffers from ripple due to internal battery resistance and external parasitic resistance (a combination of which is also known as external series resistance or ESR), and capacitive decoupling. Ripple also depends on the instantaneous current drawn from the battery to power the load. If the current drawn from the battery is too high, then the ripple tends to cause the battery voltage at boost circuit input to drop significantly, resulting in the instantaneous input power being less than the output load power. This results in clipping. If the current drawn from the battery is too low, then the ripple too will be low, which results in the instantaneous input power being greater than the output load power. This means that headroom (upper portion of the audio range) is available and that target output power could have been further increased. The resulting effect is reduced output loudness. Thus, regulating the current drawn from the battery is an important consideration in audio systems.

Conventional approaches apply a low pass filter in the battery voltage sensing path, and thus only consider the DC component of the ripple. Such approaches do not consider the instantaneous AC drop, which affects the boost circuit of the system. Even adding a margin to account for the AC ripple would not solve the problem, since the AC ripple depends on ESR which depends on ambient conditions such as temperature. Also, the decoupling capacitor causes the ripple to be frequency dependent. Thus, such conventional approaches fail to accurately compensate for the ripple, as they inevitably either over compensate (resulting in lower loudness) or under compensate (resulting in clipping and brown-out). A better solution is thus desirable.

SUMMARY

In accordance with an example, a controller comprises a voltage estimator having inputs to receive multiple input voltage values obtained from an input voltage signal and an output at which a voltage signal (estimated VBAT) representing an estimate of the true input voltage signal is output. The controller also comprises a current regulator having a first input to receive one of the multiple input voltage values, a second input coupled to the output of the voltage estimator to receive the estimated VBAT, and an output at which a calculated current limit signal is output. The current regulator tracks an estimated resistance and controls the estimated resistance to be a specific value based on the input voltage value received by the current regulator. The current regulator calculates the current limit signal based on the estimated VBAT, a clipping voltage threshold and the specific value of the estimated resistance.

In accordance with an example, an audio system comprises a voltage estimator that generates a voltage signal (estimated VBAT) representing an estimate of true voltage input to the audio system based on multiple input voltage values; a current regulator that tracks an estimated resistance and controls the estimated resistance to be a specific value based on one of the multiple input voltage values that is received by the current regulator, the current regulator calculating a current limit signal based on the estimated VBAT, a clipping voltage threshold and the specific value of the estimated resistance; a filter disposed in an audio signal path, the filter having an output at which a filtered audio signal is output; and an audio limiter having a first input at which the filtered audio signal is received, a second input at which a voltage limit signal is received, a third input at which a load resistance value determined from an audio output signal is received, and a fourth input at which an input power signal is received.

In accordance with an example, a method comprises measuring an input voltage signal to a controller of an audio system in each of multiple periods of time to calculate, for each period of time, a maximum value of the input voltage signal (maximum value), an average value of the input voltage signal (average value), and a minimum value of the input voltage signal (minimum value); outputting, by the controller, an output voltage for each period of time representing an estimate of the true value of the input voltage signal based on the maximum value for that period of time and the average of multiple maximum values sampled during that period of time; estimating a resistance for each period of time based on the minimum value for that period of time; and calculating an output current of the controller for each period of time based on the output voltage for that period of time and the estimated resistance for that period of time.

In accordance with an example, an audio system comprises a limiter having a filtered audio input at which a filtered audio signal is received, a voltage limit input at which a voltage limit signal is received, and a gain output at which a gain signal, calculated based on the filtered audio signal and the voltage limit signal, is output. The limiter includes a smoothing filter configured to estimate the amplitude of the filtered audio signal and output a signal representing a smoothened estimate of the amplitude of the filtered audio signal (smoothened estimate signal).

These and other features will be better understood from the following detailed description with reference to the accompanying drawings.

BRIEF DESCRIPTION OF THE DRAWINGS

Features of the disclosure may be understood from the following figures taken in conjunction with the detailed description.

3

Figure 2:
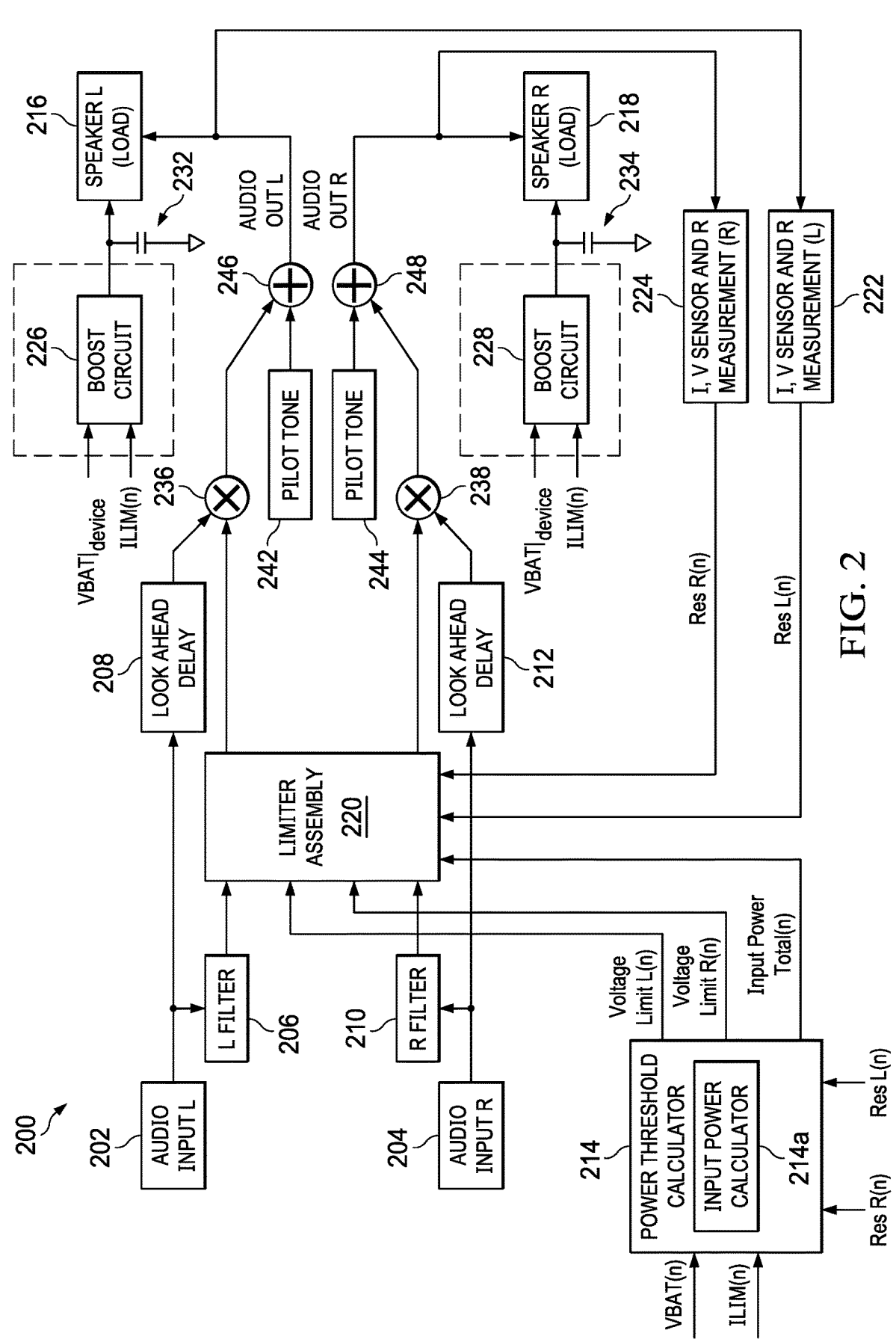
FIG. 2 is a schematic diagram of components of an example audio system that may be controlled by the controller of FIG. 1.
Figure 5:
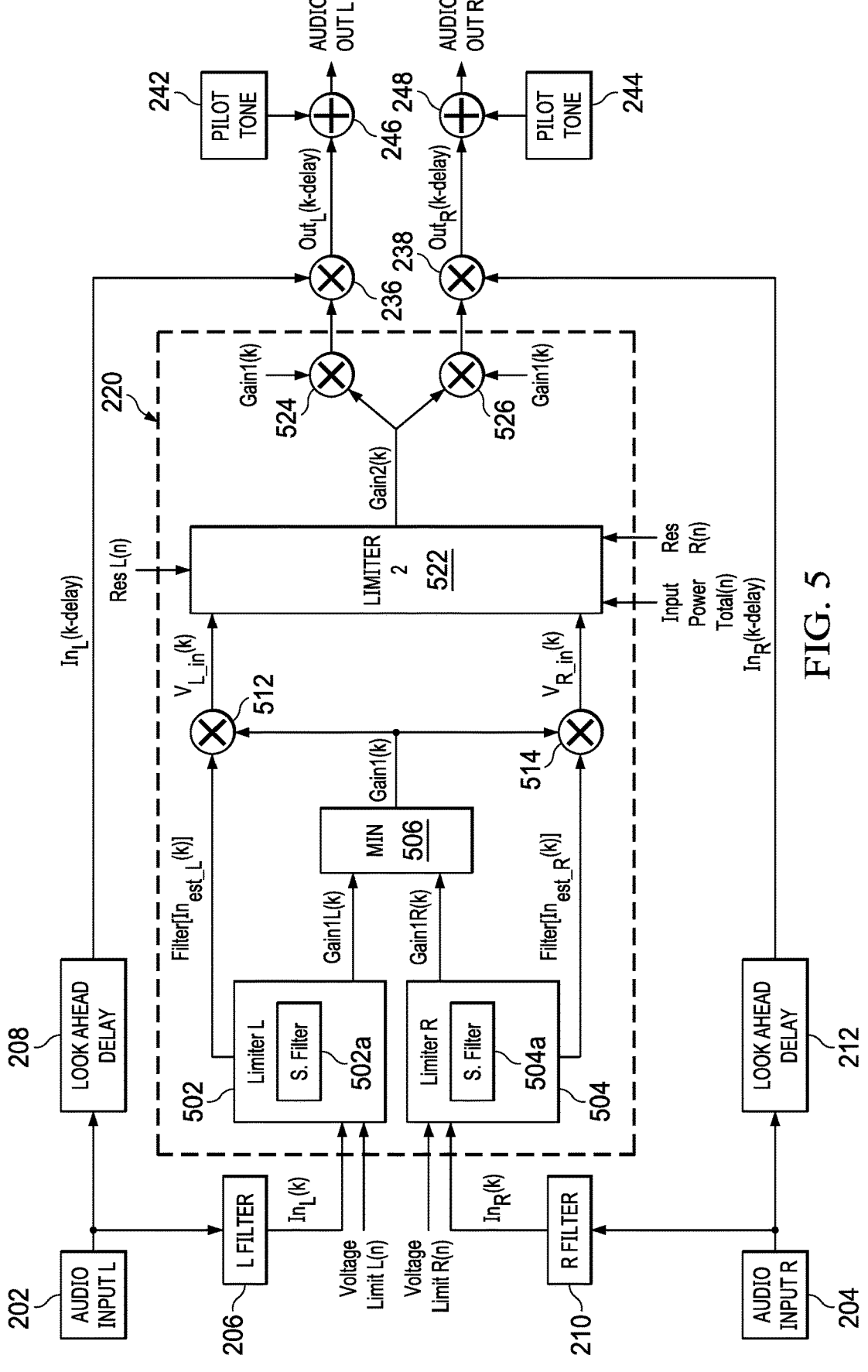

FIG. 5 is a schematic diagram of example limiters and other components of the audio system of FIG. 2.

FIG. 6 is a flow diagram of example operation of a controller, such as that shown in FIG.

Figure 7:
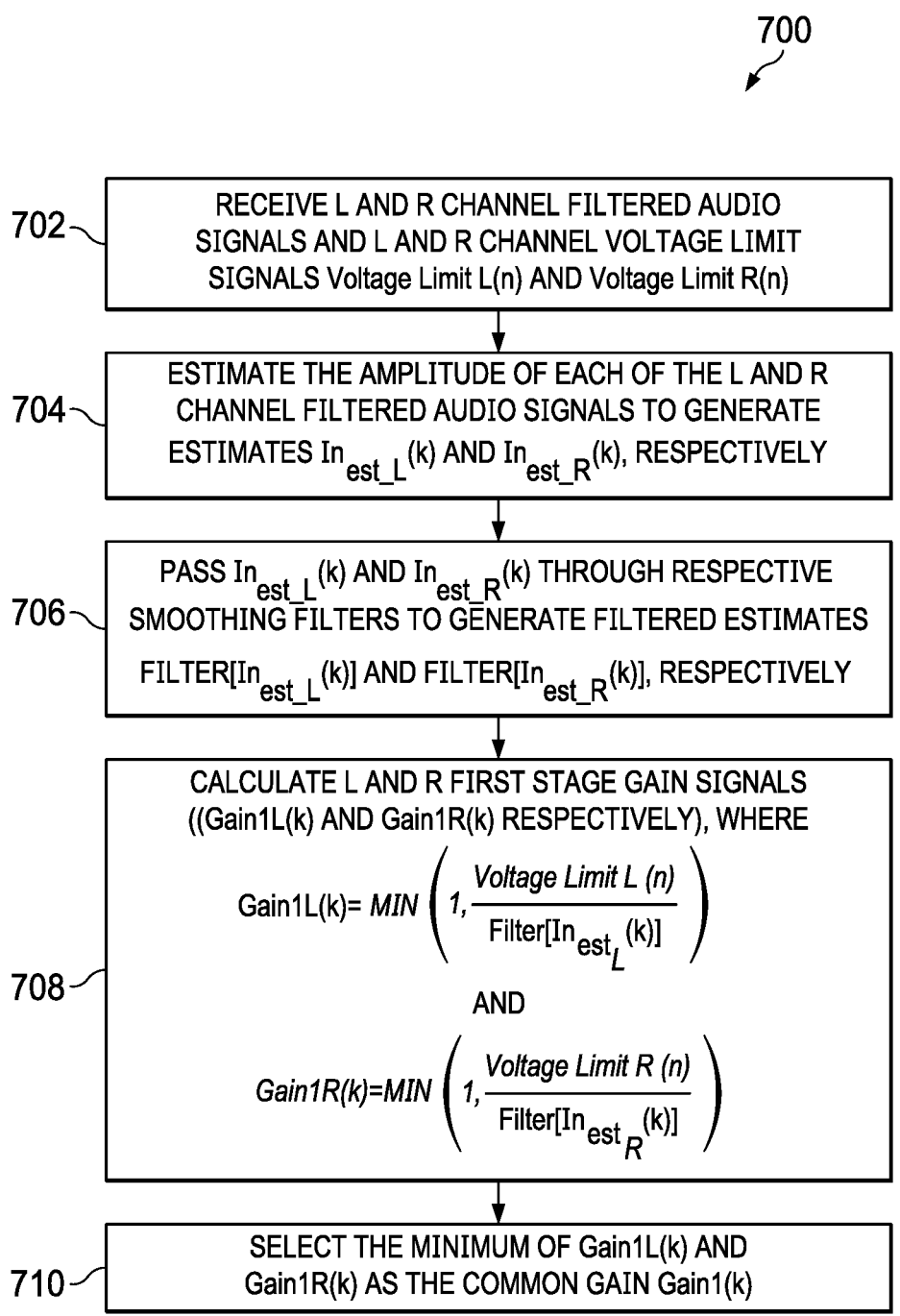

FIG. 7 is a flow diagram of example operation of a first stage limiter in a two-stage limiter assembly.

FIG. 8 is a flow diagram of example operation of a second stage limiter in a two-stage limiter assembly.

The same reference numbers are used in the drawings to designate the same or similar (structurally and/or functionally) features.

DETAILED DESCRIPTION

Specific examples are described below in detail with reference to the accompanying figures. These examples are not intended to be limiting. The objects depicted in the drawings are not necessarily drawn to scale.

In an example, audio is controlled based on estimation of true battery voltage (VBAT) from the raw battery voltage (Raw VBAT) and calculation of a target current limit (ILIM). By controlling the audio based on estimated VBAT and calculated ILIM, the target current drawn from the power supply, e.g., battery, is regulated. Calculation of ILIM is based on: estimated VBAT and adjustments made to ESR, which adjustments are based on Raw VBAT and a clipping voltage threshold ($V_{THR}$), which represents a clipping or brown-out threshold. A de-emphasis filter disposed in the audio signal path compensates for frequency-dependent, e.g., capacitive, ripple in Raw VBAT.

In an example, an audio limiter assembly allocates power in an audio system based on estimated VBAT and calculated ILIM, and includes a de-emphasis filter to compensate for capacitive ripple in Raw VBAT. In an example, a VBAT estimator estimates true battery voltage from Raw VBAT at a low ripple/silence condition. In an example, a current regulator calculates the current (ILIM) based on (estimated $VBAT-V_{THR}$)/estimated ESR, where estimated ESR is rapidly increased if estimated VBAT falls below $V_{THR}$, and if not, is slowly decreased or maintained the same depending on another condition. Estimated ESR may be reset to a default value after a prolonged period of silence.

Thus, calculated ILIM dynamically adapts to changes in system conditions by tracking VBAT and ESR, while a de-emphasis filter in the audio signal path compensates for frequency-dependent, e.g., capacitive, ripple. This ensures that the power allocated to audio playback will be the result of the instantaneous input raw battery voltage (Raw VBAT) being above $V_{THR}$ and be equal (or substantially equal) to a target output load power, which depends on estimated VBAT and ILIM. Such control of audio power results in battery current regulation, increases (e.g., maximizes) sound pressure level (SPL) and reduces (e.g., minimizes) clipping. Since the audio power regulation adapts to changing VBAT and ESR, the current drawn from the battery scales with system conditions and is automatically adjusted to the appropriate amount. This improves battery life.

Figure 1:
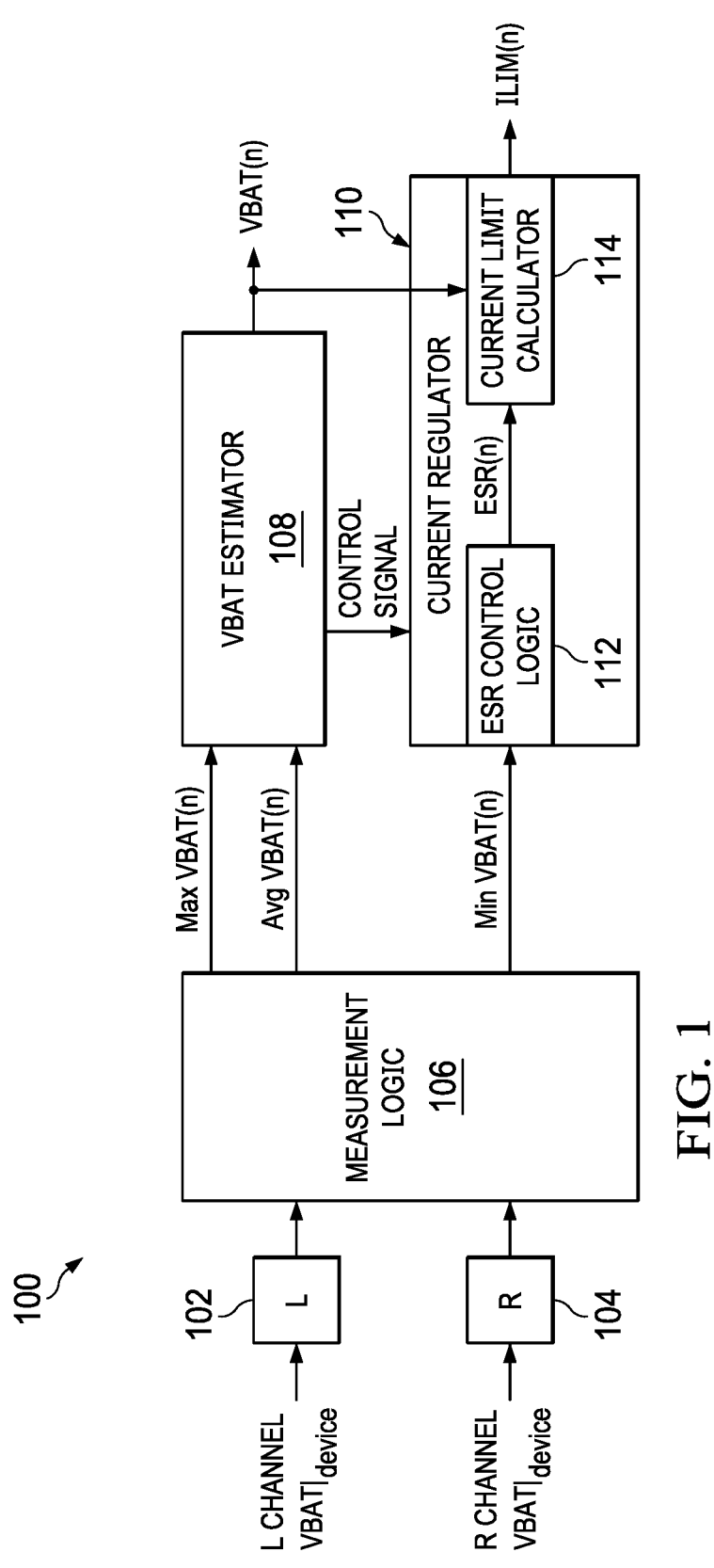
FIG. 1 is a schematic diagram of an example controller including an example battery voltage estimator and an example current regulator.

FIG. 1 illustrates a controller 100 having left (L) and right (R) battery signal sensors 102 and 104 including L and R battery signal inputs, respectively. The L and R battery input signals are each designated as $VBAT|_{device}$, such that there is L channel $VBAT|_{device}$ and R channel $VBAT|_{device}$. Each of battery signal sensors 102, 104 may include an analog-to-digital converter (ADC) to digitize the incoming analog battery signal. The sensed L and R device voltages are input to terminals of measurement logic 106 which averages the received voltages to generate a raw battery voltage signal (Raw VBAT). In another example, a single device voltage ($VBAT|_{device}$) may be input to measurement logic 106, in which case averaging is not performed, in which case Raw VBAT is the same as $VBAT|_{device}$.

Controller 100 applies a control algorithm to generate/update estimated VBAT and calculate ILIM over multiple sampling/calculation intervals, which are then used to regulate audio. The samples input to measurement logic 106 are designated by the index m, and the time interval between two successive indices m and (m−1) is designated as the sample interval. An example sample interval can be 10.4 μs (corresponding to a sampling rate of 96 KHz). This is the typical sampling rate with which the ADC digitizes the $VBAT|_{device}$ for L and R channels, although other sampling rates may be used. Additionally, measurement logic 106 may upsample the received signals from the ADC to improve the accuracy of the received samples and may reduce the time interval between successive indices m and (m−1). In an example, measurement logic 106 may upsample by a factor of 4, in which case the sample interval for successive indices m and (m−1) is 2.6 μs (corresponding to a sampling rate of 384 KHz). Calculations using a collection of samples can be updated using a larger time interval, e.g. a window of time, that is designated by the index n, and the time interval between two successive indices n and (n−1) is designated as the calculation interval. An example calculation interval can be 10 ms corresponding to samples m=0, 1, . . . N−1, where N=block size corresponding to the calculation interval and can be equal to 960 (for sampling rate=96 KHz) or equal to 3840 (for a sampling rate=384 KHz). Within a calculation interval, measurement logic 106 processes Raw VBAT (or upsampled version of Raw VBAT), which has ripple, to determine the signal's maximum value Max VBAT(n)=(max (Raw VBAT(m))$|_{m=0, 1, . . . , N-1}$), average value $$Avg\ VBAT(n) = avg(\text{Raw } VBAT) = \sum\nolimits_{m=0}^{N-1} \frac{\text{Raw } VBAT(m)}{N},$$

and minimum value Min VBAT(n)=(min(Raw VBAT(m))$|_{m=0, 1, . . . , N-1}$). For each calculation interval, measurement logic 106 outputs a Max VBAT(n) value, an Avg VBAT(n) value, and a Min VBAT(n) value.

VBAT estimator 108 has inputs to receive Max VBAT(n) and Avg VBAT(n) from measurement logic 106. Based on those input values, VBAT estimator 108 estimates VBAT for each calculation interval, i.e., VBAT(n). For each calculation interval, VBAT estimator 108 determines an intermediate value (Max VBAT Temp(n)) based on the difference between Max VBAT(n) and Avg VBAT(n). When the difference between Max VBAT(n) and Avg VBAT(n) is less than a silence voltage threshold, Max VBAT Temp(n) is equal to Max VBAT(n); otherwise, Max VBAT Temp(n) remains the same, i.e., Max VBAT Temp(n)=Max VBAT Temp(n−1). In an example, the silence voltage threshold is 10 mV. Based on Max VBAT Temp(n), VBAT estimator 108 may determine VBAT(n) to be the average of Max VBAT Temp(n) and those from a certain number of previous calculation intervals. The total number of Max VBAT Temp values used to calculate the average is denoted by M, and in such case $$VBAT(n) = \sum\nolimits_{k=0}^{M-1} \frac{\text{Max } VBAT\ Temp(n-k)}{M}.$$

M may be 5, for example. VBAT estimator 108 outputs VBAT(n) for each calculation interval. Thus VBAT(n) is an estimate of VBAT, which is the true battery voltage.

Each time VBAT is measured (i.e., each time the true battery voltage is estimated), ILIM is changed (i.e., recalculated), since ILIM is directly related to estimated VBAT (i.e., $ILIM(n)=(VBAT(n)-V_{THR})/ESR(n)$), even if ESR(n) remains constant from one calculation to the next, to ensure that the battery voltage ripple is within $V_{THR}$. The changing of ILIM is described in more detail below in the context of ESR estimation, which may also be changed depending on certain conditions.

Current regulator 110 includes ESR control logic 112 and a current limit calculator 114. ESR control logic 112 receives Min VBAT(n) from measurement logic 106. For each calculation interval n, ESR control logic 112 determines whether, and by what amount, to adjust estimated ESR based on a comparison of Min VBAT(n) with $V_{THR}$ and whether or not the audio is under compression. At each calculation interval n, ESR control logic 112 determines whether Min VBAT(n) is less than $V_{THR}$. If Min VBAT(n)<$V_{THR}$, ESR (n), which is an estimate of ESR, is increased in a fast attack manner; that is, $ESR(n)=ESR(n-1)+an$ attack amount of resistance, which may be $0.05\Omega$. This ensures that ILIM is calculated and audio power accordingly regulated so that the battery voltage ripple is within $V_{THR}$. If Min VBAT(n)$\geq$ $V_{THR}$+a threshold and the audio is compressed, ESR(n) is reduced in a slow release manner; that is, $ESR(n)=ESR(n-1)-a$ decay amount, which may be $0.01\Omega$. This ensures that available headroom is recovered when ESR reduces due to change in ambient conditions. In an example, $V_{THR}$ may be 3 V and the threshold may be 100 mV. If Min VBAT(n)$\geq$ $V_{THR}$+threshold and the audio is not under compression, estimated ESR remains the same; that is, $ESR(n)=ESR(n-1)$. This means that even if ESR has decreased due to change in ambient condition(s) there is already enough audio headroom available so no ESR adaptation is required. ESR control logic 112 transmits ESR(n) to current limit calculator 114, which also receives VBAT(n) from VBAT estimator 108. For each calculation interval, current limit calculator 114 calculates the current (ILIM(n)) according to the equation: $ILIM(n)=(VBAT(n)-V_{THR})/ESR(n)$. In an example, if Max VBAT(n) is approximately equal to Avg VBAT(n) for a period of time, e.g., prolonged silence, for example, 5 minutes), then ESR(n) may be reset to an initial value as a safety mechanism, which action may be triggered by a control signal from VBAT estimator 108 indicating such condition.

Thus, controller 100, through the control algorithm, repeatedly generates/updates VBAT(n) and calculates ILIM (n) based on system conditions. VBAT(n) and ILIM(n) are then used by other components of an example audio system 200, which is shown in FIG. 2, to regulate audio.

Whether the audio is under compression can be determined by comparing the left channel audio out signal (AUDIO OUT L) with the left channel audio input signal and comparing the right channel audio out signal (AUDIO OUT R) with the right channel audio input signal (see FIG. 2). If the amplitude of either AUDIO OUT L or AUDIO OUT R is less than the corresponding amplitude of audio input signal, then the audio is under compression due to the control algorithm. However, if Min VBAT(n)$\geq$$V_{THR}$+threshold, then there is excess headroom available to reduce (or remove) the compression. So, in such scenario, the ESR is reduced. As the ESR reduces, the ILIM increases, which means that more power (VBAT×ILIM) is available for audio and this ensures that compression is reduced or removed, which helps in increasing the loudness of the output audio. On the other hand, if the amplitude of both AUDIO OUT L and AUDIO OUT R is equal to the amplitude of the corresponding audio input signal, then the audio is not under compression due to the control algorithm. In this case, even if Min VBAT(n)$\geq$$V_{THR}$+threshold, and there is excess headroom available, there is no need to reduce ESR, increase ILIM and increase available power, because the current available power is sufficient to drive the audio without any compression.

Example audio system 200 of FIG. 2 comprises an audio signal input, which in the illustrated example, includes a left channel (L) audio signal input 202 and a right channel (R) audio signal input 204 from which the left and right channel audio signals are respectively input. The output of L audio signal input 202 is coupled to a left channel filter 206, e.g., a de-emphasis filter, and a look ahead delay 208. The output of R audio signal input 204 is coupled to a right channel filter 210, e.g., a de-emphasis filter, and a look ahead delay 212. De-emphasis filters 206 and 210 compensate for frequency-dependent, e.g., capacitive, ripple in the audio signal path. De-emphasis filters 206 and 210 de-emphasize higher frequency components of the audio signal.

Example audio system 200 further comprises a power threshold calculator 214, which has a voltage input at which VBAT(n) is received and a current input at which ILIM(n) is received. Power threshold calculator 214 also includes inputs to receive left and right channel resistance values (Res L(n) and Res R(n)) indicative of the time-varying resistances in the left and right audio output signals delivered to the load, i.e., left and right speakers 216 and 218, respectively. As described in more detail below in connection with FIG. 4, for each calculation interval n, power threshold calculator 214 calculates voltage limit signals (Voltage Limit L(n) and Voltage Limit R(n)) based on VBAT(n), ILIM(n) and the resistances of the output audio signals (Res L(n) and Res R(n)). Res L(n) is considered in calculating Voltage Limit L(n), and Res R(n) is considered in calculating Voltage Limit R(n).

Example power threshold calculator 214 includes an input power calculator 214a which has inputs at which VBAT(n) and ILIM(n) are received. From these signals and a scale factor, input power calculator 214 calculates an input power total (Input Power Total(n)), which is one of the inputs to limiter assembly 220. In an example, the scale factor may be 0.85.

Limiter assembly 220, which is shown and described in more detail with respect to FIG. 5, also receives left (L) and right (R) filtered audio signals from filters 206 and 210, respectively, the Voltage Limit L(n) and Voltage Limit R(n) voltage signals from power threshold calculator 214, as well as the Res L(n) and Res R(n) values, which are determined and updated by sensor & measurement components 222 and 224, respectively, at each calculation interval n.

Current/voltage sensor & load resistance measurement component 222 has an input coupled to the L audio out channel, an ADC to sense and digitize the current and voltage in that output signal, and circuitry to determine the load resistance (Res L(n)) based thereon. Similarly, current/voltage sensor & load resistance measurement component 224 has an input coupled to the R audio out channel, and ADC to sense and digitize the current and voltage in that output signal, and appropriate circuitry to determine the load resistance (Res R(n)) based thereon. Res L(n) and Res R(n), which are the same values input to power threshold calculator 214, are used by limiter assembly 220 to control total power and make use of any available headroom.

Limiter assembly 220 controls the gain based on the left and right channel filtered audio signals received from filters 206 and 210, respectively, based on Voltage Limit L(n), Voltage Limit R(n), Input Power Total(n), Res L(n) and Res R(n). Limiter assembly 220 outputs left and right channel gain signals to multipliers 236 and 238, respectively. Multiplier 236 also receives the output of look ahead delay 208, and multiplier 238 also receives the output of look ahead delay 212.

Multiplier 236 multiplies the output of look ahead delay 208 with left channel gain signal from limiter assembly 220 to generate an audio signal that is input to adder 246, which also receives pilot tone 242. Multiplier 238 multiplies the output of look ahead delay 212 with the right channel gain signal from limiter assembly 220 to generate an audio signal that is input to adder 248, which also receives pilot tone 244. Based on their respective inputs, adders 246 and 248 generate left and right channel audio out signals, respectively. Additional description of this processing is described in connection with FIG. 5.

Figure 3:
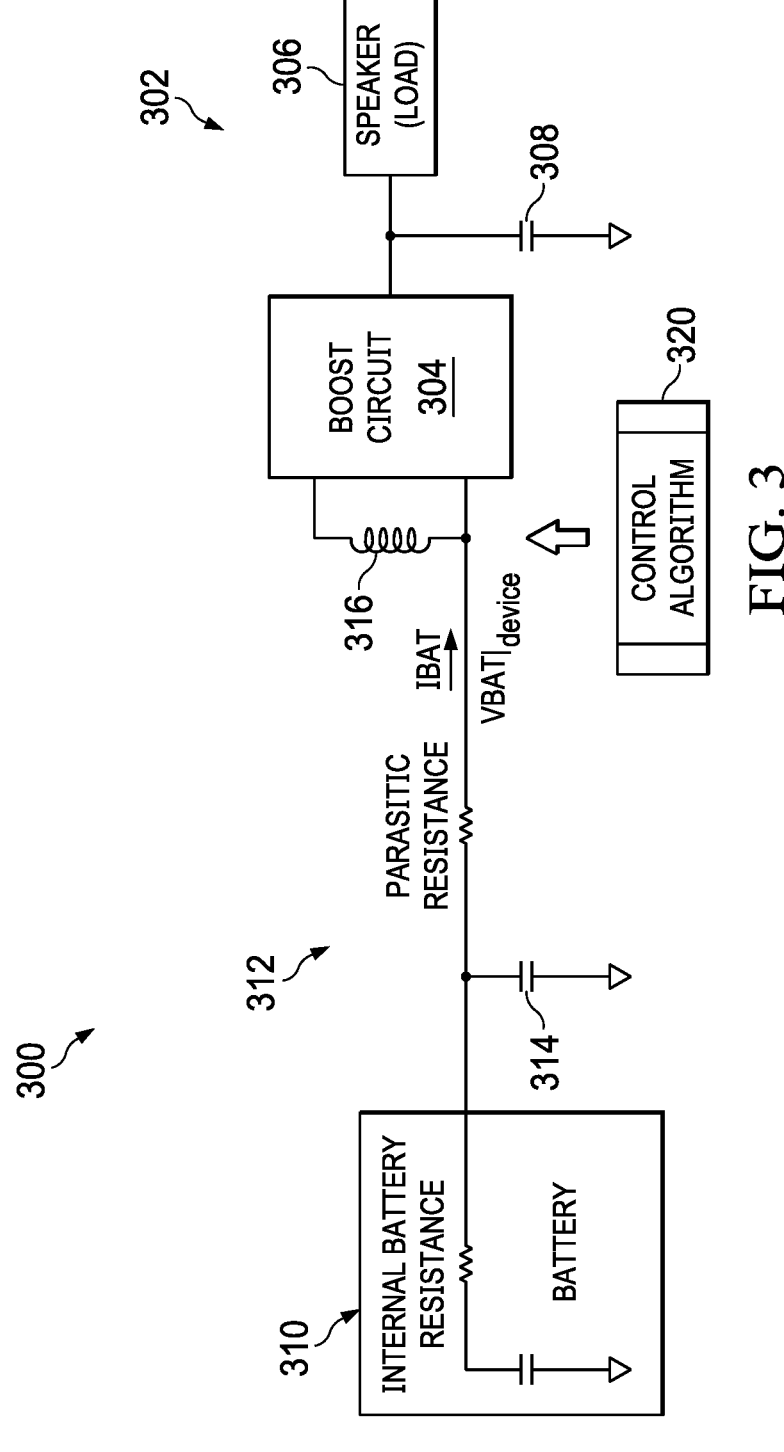
FIG. 3 is a schematic diagram of an example battery system coupled to an example audio system.

Audio system 200 further comprises a boost circuit for each speaker. To that end, in the illustrated example, boost circuit 226 is coupled to L speaker 216, and boost circuit 228 is coupled to R speaker 218. Each boost circuit may be part of an amplifier, e.g., a Class D amplifier, indicated by the dashed enclosure. Each boost circuit 226 and 228 has a voltage input at which $VBAT|_{device}$ is received and a current input at which ILIM(n) is received, as well as an output coupled to speaker 216 and 218, respectively. The output drives power for speakers 216 and 218 to play Audio Out L and Audio Out R, respectively. Each boost circuit 226 and 228 may also include, or have coupled to it, a boost inductor, as shown in FIG. 3. An output capacitor 232 is disposed in the power transmission path between boost circuit 226 and L speaker 216. Likewise, output capacitor 234 is disposed in the power transmission path between boost circuit 228 and R speaker 218. The effect of the output capacitors 232 and 234 in the context of the control algorithm performed by controller 100 is described in more detail below in connection with FIG. 3.

FIG. 3 is a schematic diagram showing a battery system 300 coupled to an audio system 302, e.g., audio system 200, which includes a boost circuit 304 and a load, e.g., speaker 306, coupled to the output of boost circuit 304. Boost circuit 304 may correspond to either of the boost circuits 226 or 228 of FIG. 2, and speaker 306 may correspond to either of speakers 216 or 218 of FIG. 2. Audio system 302 also includes an output capacitor 308 coupled to the output of boost circuit 304. Output capacitor 308 may correspond to either of the output capacitors 232 or 234 of FIG. 2.

Battery system 300 includes a battery 310 which includes internal resistance. There is also external parasitic resistance. The internal battery resistance plus the external parasitic resistance represents the ESR, which is identified by reference numeral 312 in FIG. 3. As described above, current regulator 110 tracks and considers ESR 312 in calculating ILIM(n). The effect of decoupling capacitance caused by decoupling capacitor 314 is also considered in de-emphasis filters 206 and 210 of audio system 200 in FIG. 2. Decoupling capacitor 314 is interposed between the two resistive components of ESR 312.

Boost circuit 304 has one terminal which is coupled to a boost inductor 316 to receive $VBAT|_{device}$; the same terminal is coupled to an ADC whose other terminal is coupled to measurement logic 106 shown in FIG. 1. The ADC functions similarly to the ADC in each of sensors 102 and 104. Boost inductor 316 draws current from battery 310 and stores power during the charging phase. The power stored by inductor 316 depends on IBAT, which is the current drawn from battery 310 and $VBAT|_{device}$, which is the instantaneous voltage at voltage input terminal of boost circuit 304. Inductor 316 then transfers power to output capacitor 308 in the discharge phase, and output capacitor 308 drives load 306 to play audio through an amplifier, e.g., a Class D amplifier. Boost circuit 304 uses the received ILIM(n) to program the peak current limit of boost circuit 304. Boost inductor 316 charges until a peak current limit is reached. That is, audio is regulated such that boost inductor 316 charges using a current that is less than ILIM(n). In an example, this peak current limit may be dynamically updated based on ILIM(n) calculated by current limit calculator 114.

The control algorithm, described above and indicated by reference numeral 320 in FIG. 3, regulates audio power based on $VBAT|_{device}$ (or Raw VBAT). That is, the true battery voltage VBAT is estimated, and the audio is regulated such that any transient drop in $VBAT|_{device}$ below $V_{THR}$ is quickly corrected by rapidly increasing the estimate of ESR 312 to elevate $VBAT|_{device}$ (or Raw VBAT) above $V_{THR}$. Ignoring the frequency component due to decoupling capacitor 314, $VBAT|_{device}$ is equal to the true battery voltage less the product of ESR 312 and IBAT, i.e. $VBAT|_{device}$=VBAT−ESR×IBAT. With ILIM defined as (VBAT−$V_{THR}$)/ESR, as described above, if IBAT is less than or equal to ILIM, then $VBAT|_{device}$ is greater than or equal to $V_{THR}$. Under this condition, when IBAT=ILIM, $VBAT|_{device}$=$V_{THR}$, and this corresponds to the maximum instantaneous power delivered by battery 310 which is equal to the product of $V_{THR}$ and ILIM i.e., Power($VBAT|_{device}$)= $V_{THR}$×ILIM. To ensure IBAT is less than or equal to ILIM, audio should be regulated such that audio power is less than or equal to the product of $V_{THR}$ and ILIM.

However, the algorithm regulates audio voltage such that Power(Audio)≤VBAT×ILIM (not $V_{THR}$×ILIM), i.e., it overdrives the system because VBAT>$V_{THR}$. Because audio is a dynamic signal, there will be times of low audio levels when Power(Audio)≤$V_{THR}$×ILIM, i.e., Power($VBAT|_{device}$) and there will be times of high audio levels when Power (VBAT|_{device})≤Power(Audio)≤VBAT×ILIM. For low audio levels when Power(Audio)≤Power($VBAT|_{device}$) the power delivered by battery 310 is sufficient to drive the audio power. However, for high audio levels, when Power (VBAT|_{device})≤Power(Audio)≤VBAT×ILIM, the power delivered by the battery is insufficient to drive the audio power, indicating that there is a power shortfall. This shortfall is compensated by output capacitor 308, which is charged when excess power is available, i.e., when Power (VBAT|_{device}) is greater than Power(Audio), i.e., in periods of low audio levels. Depending on how much shortfall output capacitor 308 can accommodate, the scale factors (Scale L, Scale R and Scale Total) of power threshold calculator 214 (shown in FIG. 4) can be tuned such that Power(Audio) does not exceed the sum of Power (VBAT|_{device}) and Power(Output Capacitor) and there is no clipping of the output audio signal. The scale factors are described in more detail in the context of the description of FIG. 4, which shows an example power threshold calculator 214.

$VBAT|_{device}$ has ripple, which depends on ESR 312, the capacitance of decoupling capacitor 314 and IBAT. Decoupling capacitor 314 acts as a low pass filter to reduce the AC component of the ripple of $VBAT|_{device}$ at higher frequencies, which means that more power can be accommodated at higher frequencies. This accommodation is realized by de-emphasis filters 206 and 210 of audio system 200 of FIG. 2.

These filters 206 and 210 are low pass filters modeled according to decoupling capacitor 314, and they de-emphasize the audio signal level at high frequencies before sending it to limiter assembly 220 of FIG. 2. Due to the de-emphasis effect, the gain control of limiter assembly 220 at high frequency is less, meaning that the audio output will have more power. An example cut-off frequency of de-emphasis filters 206 and 210 is 43 KHz. The peak level of $VBAT|_{device}$ also reduces at higher frequencies because of the DC component of the ripple. Thus, VBAT is estimated during low ripple, silence condition, i.e., when the ripple is less than 10 mV.

Figure 4:
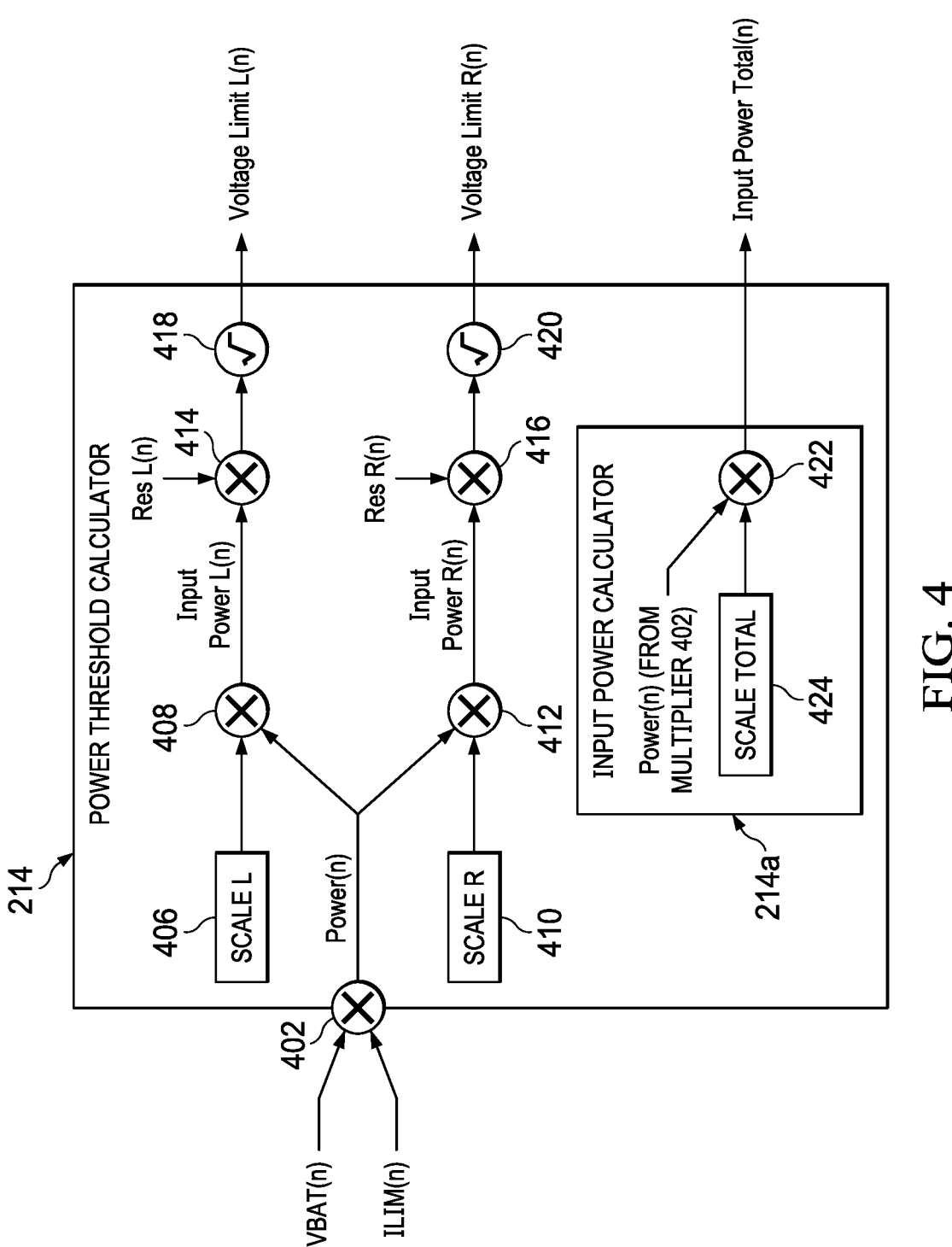
FIG. 4 is a schematic diagram of an example power threshold calculator, such as that shown in FIG. 2.

FIG. 4 is a schematic diagram of power threshold calculator 214 of FIG. 2. Power threshold calculator 214 includes a multiplier component 402, which has a voltage input and current input. VBAT(n) is received at the voltage input, and ILIM(n) is received at the current input. Power threshold calculator 214 outputs two voltage signals: a left channel voltage limit signal (Voltage Limit L(n)) and a right channel voltage limit signal (Voltage Limit L(n)), which are updated every calculation interval n. Power threshold calculator 214 also outputs a third signal: Input Power Total(n), which represents the available power and is also updated every calculation interval n.

Based on the voltage and current signal inputs, multiplier 402 calculates an intermediate power signal (Power(n)) that is delivered to multiplier 408 and multiplier 412 for the left and right channels, respectively.

In the illustrated example, Power(n) output from multiplier 402 is multiplied by a scale factor for the left channel (Scale L) 406 using multiplier 408 and is multiplied by a scale factor for the right channel (Scale R) 410 using multiplier 412. Scale L and Scale R typically reflect the efficiency of the system (including the boost circuits 226 and 228 and corresponding Class D amplifiers) and the capacity of output capacitor 308 to accommodate extra power. The scale factor of Scale L 406 and Scale R 410 may each have a value of 0.85 (85%), as an example.

Multiplier 408 thus scales the intermediate power signal received from multiplier 402 to generate an input power L signal (Input Power L(n)). Similarly, multiplier 412 scales Power(n) received from multiplier 402 to generate an input power R signal (Input Power R(n)). Input Power L(n) and Input Power R(n) are input to multipliers 414 and 416, respectively, which also receive resistance values Res L(n) and Res R(n). The product of Input Power L(n) and Res L(n) is input to a square root functional component 418 which computes the square root of such product to generate the limit L voltage signal. The product of Input Power R(n) and Res R(n) is input to a square root functional component 420 to generate the limit R voltage signal. Thus, Voltage Limit L(n=$\sqrt{InputPowerL(n) \times ResL(n)}$, and Voltage Limit R(n)= $\sqrt{InputPowerR(n) \times ResR(n)}$.

Input power calculator 214a of power threshold calculator 214 includes a multiplier 422 that receives the intermediate power signal (Power(n)) from multiplier 402 and a total scale factor (Scale Total) 424 by which the intermediate power signal is scaled to generate Input Power Total(n). The scale factor of Scale Total 424 may be, for example, 0.85 (85%).

FIG. 5 is a schematic diagram of limiter assembly 220 along with upstream and downstream components for context. In a multi-channel system, limiter assembly 220 includes two first stage limiters: left limiter (Limiter L) 502 and right limiter (Limiter R) 504 to provide more headroom in such system. Limiter L 502 has an audio input at which the filtered audio signal ($\ln_L(k)$) is received from L filter 206 and a voltage input at which Voltage Limit L(n) is received from power threshold calculator 214. Similarly, Limiter R 504 has an audio input at which the filtered audio signal ($\ln_R(k)$) is received from R filter 210 and a voltage input at which Voltage Limit R(n) is received from power threshold calculator 214. The audio samples are designated by the time index k, and the time interval between two successive indices k and (k−1) is designated as the audio sample interval. An example audio sample interval can be 20.8 μs (corresponding to a sampling rate of 48 KHz).

Limiter L 502 receives the left channel filtered audio signal ($\ln_L(k)$) and compares its absolute value ($|\ln_L(k)|$) with the estimate of the peak in the immediate previous audio calculation interval ($\ln_{est\_L}(k-1)$) to estimate the amplitude of $\ln_L(k)$, such estimate denoted by $\ln_{est\_L}(k)$. If $\ln_{est\_L}(k-1) < |\ln_L(k)|$, then $\ln_{est\_L}(k) = |\ln_L(k)|$; otherwise, $\ln_{est\_L}(k) = \ln_{est\_L}(k-1) \times a$ decay factor. Similarly, limiter R 504 receives the right channel filtered audio signal ($\ln_R(n)$) and compares its absolute value ($|\ln_R(k)|$) with the estimate of the peak in the immediate previous audio calculation interval ($\ln_{est\_R}(k-1)$) to estimate the amplitude of $\ln_R(k)$, such estimate denoted by $\ln_{est\_R}(k)$. If $\ln_{est\_R}(k-1) < |\ln_R(k)|$, then $\ln_{est\_R}(k) = |\ln_R(k)|$; otherwise, $\ln_{est\_R}(k) = \ln_{est\_R}(k-1) \times a$ decay factor. The decay factor may be 0.9993 (corresponding to a decay time constant of 30 ms for an audio sampling rate of 48 KHz), for example. To prevent or minimize distortion, limiter L 502 and limiter R 504 may include respective smoothing filters 502a and 504a through which $\ln_{est\_L}(k)$ and $\ln_{est\_R}(k)$ are respectively passed to generate signals Filter[$\ln_{est\_L}(k)$] and Filter[$\ln_{est\_R}(k)$], respectively. Limiter L 502 outputs the Filter[$\ln_{est\_L}(k)$], and Limiter R 504 outputs the Filter[$\ln_{est\_R}(k)$] which are smoothened estimates of the amplitude of $\ln_L(k)$ and $\ln_R(k)$, respectively. Limiter L 502 calculates and outputs a gain signal (Gain1L(k)) according to the formula:

$$MIN\left(1, \frac{\text{Voltage Limit } L(n)}{\text{Filter}[In_{est_L}(k)]}\right),$$

and limiter R 504 calculates and outputs a gain signal (Gain1R(k)) according to the formula:

$$MIN\left(1, \frac{\text{Voltage Limit } R(n)}{\text{Filter}[In_{est_R}(k)]}\right).$$

Each smoothing filter 502a and 504a ensures that the corresponding gain signal does not have abrupt transitions and prevents audio artifacts. To preserve audio balance between the two channels, especially for balanced speakers which respond uniformly to the same audio frequency, a common gain may be used, which is the minimum of Gain1L(k) and Gain1R(k). Thus, component 506 selects and outputs the minimum of Gain1L(k) and Gain1R(k)) as Gain1(k). For unbalanced speakers, for example, a loudspeaker and a receiver speaker, or a woofer speaker and a tweeter speaker, which do not respond uniformly to the same audio frequency, component 506 may be omitted, and in such cases Gain1L(k) and Gain1R(k) is used for subsequent calculations.

Multipliers 512 and 514 each receive the common gain signal Gain1(k) for balanced speakers. For unbalanced speakers, multiplier 512 receives gain signal Gain1L(k) and multiplier 514 receives gain signal Gain1R(k). Multiplier 512 also receives Filter[In$_{est\_L}$(k)] from Limiter L 502, multiplies Filter[In$_{est\_L}$ (k)] with Gain1(k) for balanced speakers (or Gain1L(k)) for unbalanced speakers) and outputs the product $V_{L\_in}$(k). Multiplier 514 also receives Filter[In$_{est\_R}$(k)] from Limiter R 504, multiplies Filter[In$_{est\_R}$(k)] with Gain1(k) for balanced speakers (or Gain1R(k) for unbalanced speakers) and outputs the product $V_{R\_in}$(k).

In a multi-channel system, limiter assembly 220 further includes a second stage limiter (Limiter 2) 522 that has two voltage inputs, one of which receives $V_{L\_in}$(k) and the other of which receives $V_{R\_in}$(k). Second stage limiter 522 has two resistive value inputs, one of which receives Res L(n) and the other of which receives Res R(n). Second stage limiter 522 has a power input at which Input Power Total(n) is received. The stereo input power (Stereo Input Power(k)) to second stage limiter 522 equals $V_{L\_in}$(k)²/Res L(n)+$V_{R\_in}$(k)²/Res R(n), while the available power is given by the Input Power Total(n). Hence, the output of second stage limiter 522, denoted by $$Gain2(k) = MIN\left(1, \sqrt{\frac{Input\ Power\ Total(n)}{Stereo\ Input\ Power(k)}}\right).$$

A left channel multiplier 524 multiplies Gain2(k) with Gain1(k), received from component 506 for balanced speakers (or Gain1L(k) from Limiter L 502 for unbalanced speakers), the result of which is multiplied with the left channel audio signal that has been delayed by look ahead delay 208 by multiplier 236 to generate a left channel audio output denoted by Out$_L$(k–Delay). A right channel multiplier 526 multiplies Gain2(k) with Gain1(k), received from component 506 for balanced speakers (or Gain1R(k) from Limiter R 504 for unbalanced speakers), the result of which is multiplied with the right channel audio signal that has been delayed by look ahead delay 212 by multiplier 238 to generate right channel audio output denoted by Out$_R$(k–Delay). Look ahead delays 208 and 212 ensure that the slow application of respective gain signals due to the smoothing filters 502a and 504a described above do not cause clipping and that the audio is delayed by the correct amount to compensate for the slow gain. In an example, Delay may be 128 samples corresponding to a look ahead delay of 2.7 μs for audio sampling rate=48 KHz.

The two-stage limiter process ensures maximum utilization of audio headroom in multi-channel system. In a stereo system, the conventional approach is to statically divide the total power across the L and R channels (typically in equal proportion for balanced speakers). However, a static allocation may result in excess power available in one channel (due to low audio level in that channel), but the excess power cannot be used in the other channel, which, in the meantime, has been reduced in audio level because it was exceeding the static power allocated in that channel. On the other hand, the two-stage limiter need not divide the total power; instead it can, as an example, allocate the total power itself, individually, to both the channels, i.e., it can over-allocate the power for the first stage limiter. In an example, Voltage Limit L(n), Voltage Limit R(n) and Input Power Total(n) can be such that the power available for the L channel and the power available for the R channel is equal to Input Power Total(n). This way, both channels would be limited only by the total power of the system (instead of a share or fraction of the total power). The possible over allocation of power in the first stage limiter (e.g., limiters 502 and 504) can be mitigated by the second stage limiter (e.g., limiter 522) which can output a second stage Gain2(k) that ensures that the final audio power from L channel and R channel is not greater than Input Power Total(n).

A pilot tone 242 in the form of a signal of a specific frequency and amplitude may be added to Out$_L$(k–Delay) to generate the left channel audio out signal (Audio Out L), and a pilot tone 244 in the form of a signal of a specific frequency and amplitude may be added to Out$_R$(k–Delay) to generate the right channel audio out signal (Audio Out R), as is known in the art. In an example, the pilot tone may have a frequency of 16 Hz and an amplitude of 90 mV. The frequency and amplitude of pilot tone 242 may be the same or different than those of pilot tone 244. The pilot tones 242 and 244 are used in the sensor & load resistance measurement components 222 and 224, respectively, to determine the values of Res L(n) and Res R(n) from Audio Out L and Audio Out R, respectively.

In a single channel system, second gain signal (Gain2(k)) need not be calculated; instead, a single first gain signal (e.g., Gain1L(k) or Gain1R(k)) may be used as the input to a single multiplier (236 or 238) to be multiplied with a single delayed audio signal (e.g., In$_L$(k–delay) or In$_R$(k–delay)), with additional processing continuing along either the left or right channel path, to generate a single Audio Out signal. Thus, components associated with calculation of Gain2(K) may be omitted in a single channel system. Alternatively, in a single channel system, limiter 522 may operate as a pass-through, i.e., gain=1, because the first stage limiter 502 or 504 will ensure the proper relationship between power, resistance and voltage.

FIG. 6 is a flow diagram of an example method 600 of operating a controller, e.g., controller 100, including measurement logic, a battery voltage estimator and a current regulator. In operation 602, an analog input voltage signal is digitized and sampled in each of multiple calculation periods of time to calculate, for each period of time, a maximum value, an average value, and a minimum value of the input voltage signal. In operation 604, an output voltage signal (VBAT(n)) representing an estimate of the true input battery voltage is generated and output for each period of time based on the maximum value for that period of time and the average of multiple maximum values obtained during that period of time. In operation 606, a resistance (ESR(n)) is estimated for each period of time based on the minimum value for the corresponding period of time. In operation 608, a current signal (ILIM(n)) is calculated and output for each period of time based on the output voltage signal for that period of time and the estimated resistance for that period of time.

FIG. 7 is a flow diagram of an example method 700 of operating a first stage limiter, e.g., limiters 502 and 504 and component 506, in a two-stage limiter assembly in a system with balanced speakers. In operation 702, left (L) and right (R) channel filtered audio signals and L and R channel voltage limit signals (Voltage Limit L(n) and Voltage Limit R(n)) are received. In operation 704, the amplitude of each of the L and R channel filtered audio signals is estimated to generate estimates In$_{est\_L}$(k) and In$_{est\_R}$(k), respectively. In operation 706, In$_{est\_L}$(k) and In$_{est\_R}$(k) are passed through respective smoothing filters to generate filtered estimates Filter[In$_{est\_L}$(k)] and Filter[In$_{est\_R}$(k)], respectively. In operation 708, L and R first stage gain signals Gain1L(k) and Gain1R(k) are calculated as follows:

$$Gain1L(k) = MIN\left(1, \frac{Voltage\ Limit\ L(n)}{Filter[In_{est_L}(k)]}\right), and$$

13

-continued $$\left(Gain1R(k) = \text{MIN}\left(1, \frac{\text{Voltage Limit } R(n)}{\text{Filter}[In_{est_R}(k)]}\right)\right).$$

In operation 710, the minimum of Gain1L(k) and Gain1R(k) is selected as a common gain Gain1(k).

FIG. 8 is a flow diagram of an example method 800 of operating a second stage limiter, e.g., limiter 522, in a two-stage limiter assembly in a system with balanced speakers. In operation 802, Gain1(k), received from the first stage limiter, is multiplied with the L and R channel filtered audio signals, respectively, to generate voltage signals $V_{L\_in}(k)$ and $V_{R\_in}(k)$, respectively. In operation 804, $V_{L\_in}(k)$ and $V_{R\_in}(k)$ are input to the second stage limiter, along with Res L(n), Res R(n) and Input Power Total(n). In operation 806, Stereo Input Power(k) is calculated according to the formula: $V_{L\_in}(k)^2$/Res L(n)+$V_{R\_in}(k)^2$/Res R(n). In operation 808, Gain2(k), which is the output of the second stage limiter, is calculated according to the formula:

$$\text{MIN}\left(1, \sqrt{\frac{\text{Input Power Total}(n)}{\text{Stereo Input Power}(k)}}\right).$$

FIGS. 6, 7 and 8 each depict one possible order of operations employed to control an audio system. Not all operations need necessarily be performed in the order described. Some operations may be combined into a single operation. Additional operations and/or alternative operations may be performed depending on the particular audio system. For example, in a system with unbalanced speakers, the individual left and right channel gains (Gain1L(k) and Gain1R(k)) would be used, instead of a common gain (Gain1(k)), as described above.

The foregoing describes an intelligent power management solution that improves audio performance while managing power supply ripple and preserving battery life. In various examples, control components of audio playback systems may be configured and operated to provide improved loudness and dynamic range, particularly for audio with a large variation in content, as well as less distortion. The control techniques described herein are effective at all battery conditions, especially at low battery conditions. In addition to improving sound quality, examples described herein may extend battery life.

In examples, VBAT ripple is taken into consideration while regulating current drawn from the battery. Even if VBAT is fixed, the ripple at the boost circuit input may cause clipping if the output power requirement exceeds the instantaneous power available at the boost circuit input. In examples, optimum current regulation is achieved if the audio power is regulated such that it is less than the available power after considering the ripple in VBAT. In examples, audio power is regulated in such a way that it is very close to the available power so that the headroom and loudness is maximized and yet there is no audio clipping/distortion. In examples, to compute the optimum current limit, true battery voltage VBAT is estimated at silence/low ripple condition. In examples, the effect of ESR on ripple (slow change) is compensated by an iterative process; estimated ESR is increased whenever the instantaneous voltage at the boost circuit input falls below the clipping threshold. Similarly, when such voltage goes above the clipping threshold, the estimated ESR is decreased at a very slow rate to track changes in ESR due to change in system conditions (which is usually a very slow phenomenon). In examples, the effect of the decoupling capacitor on ripple (which is usually a fast, frequency dependent phenomenon) is compensated by a filter. As the frequency of the audio input changes, the filter allows frequency dependent power/current regulation to maximize the audio loudness without sacrificing audio quality (i.e., without clipping or distortion).

The term "coupled" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" may refer to a node, interconnection, pin and/or a lead. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. For example, an average of multiple Min VBAT(n) values may be used to adjust ESR. Moreover, while examples shown are directed to stereo and mono solutions, the teachings may be applied to multi-channel systems in which the number of channels is greater than 2. In such case, power threshold calculator 214 outputs a Voltage Limit signal for each channel, limiter assembly 220 receives a filtered audio signal for each channel, and the first stage of limiter assembly 220 includes a limiter for each channel. Also, the teachings may be applied to boost circuits, which, in addition to having control on the peak current limit, may also have control on the duty cycle of charge and discharge.

Features described herein may be applied in other environments and applications consistent with the teachings provided.

What is claimed is:

1. An audio system comprising:
a voltage estimator having inputs, a first output, and a second output, wherein the first output of the voltage estimator is configured to provide a voltage that represents an estimate of a voltage input of the audio system based on voltages provided at the inputs of the voltage estimator;
a current regulator having a first input, a second input, and an output, wherein the first input of the current regulator is coupled to the second output of the voltage estimator and the second input of the current regulator is coupled to the first output of the voltage estimator;
a filter disposed in an audio signal path, the filter having an output; and
an audio limiter having a first input coupled to the output of the filter, a second input configured to receive a voltage limit voltage.

2. The audio system of claim 1, wherein the audio limiter is configured to control power allocated for audio playback based on the output of the filter, the voltage limit voltage, a load resistance value, and an input power voltage.

3. The audio system of claim 1, further comprising:
a boost circuit having a first input configured to receive a device voltage, and a second input configured to receive a current limit voltage; and
an inductor coupled to the first input of the boost circuit, wherein the current limit voltage is configured to limit a peak of a current drawn from a battery via the inductor.

4. The audio system of claim 3, further comprising a speaker coupled to an output of the boost circuit.

5. The audio system of claim 1, further comprising:
a power threshold calculator having a first input coupled to the first output of the voltage estimator, a second input configured to receive a the current limit voltage, and a third input configured to receive a load resistance value.

6. The audio system of claim 5, wherein the power threshold calculator is configured to:
calculate a scaled input power based on the first output of the voltage estimator, a current limit voltage, and a scale factor; and
calculate the voltage limit voltage based on the scaled input power and the load resistance value.

7. The audio system of claim 6, wherein the power threshold calculator includes an input power calculator configured to calculate an input power total signal based on the scaled input power.

8. A method comprising:
measuring an input voltage signal to a controller in each of multiple periods of time to calculate, for each period of time, a maximum value of the input voltage signal (maximum value), an average value of the input voltage signal (average value), and a minimum value of the input voltage signal (minimum value);
outputting, by the controller, an output voltage for each period of time representing an estimate of an actual value of the input voltage signal based on the maximum value for that period of time and an average of multiple maximum values sampled during that period of time;
estimating a resistance for each period of time based on the minimum value for that period of time; and
calculating an output current of the controller for each period of time based on the output voltage for that period of time and the estimated resistance for that period of time.

9. The method of claim 8, wherein the output voltage for each period of time is determined based on an intermediate value that is determined based on a difference between the maximum value for that period of time and the average value obtained during that period of time compared to a silence voltage threshold.

10. The method of claim 9, wherein, for each period of time, the output voltage is determined based on an average of multiple intermediate values, one from a present period of time and each of the others from a respective previous period of time.

11. The method of claim 9, wherein, for each period of time, when the comparison indicates that the difference is less than the silence voltage threshold, the intermediate value is determined to be equal to maximum value obtained during that period of time.

12. The method of claim 9, wherein, for each period of time, when the comparison indicates that the difference is greater than or equal to the silence voltage threshold, the intermediate value is maintained the same as in an immediate previous period of time.

13. The method of claim 8, wherein the estimating of the resistance for each period of time includes comparing the minimum value for that period of time to a clipping voltage threshold.

14. The method of claim 13, wherein, for each period of time, when the comparing indicates that the minimum value is less than the clipping voltage threshold, the estimated resistance is determined to be the sum of the estimated resistance for an immediately previous period of time and a first amount of resistance.

15. The method of claim 13, wherein, for each period of time, when the comparing indicates that the minimum value is greater than or equal to the clipping voltage threshold, the method further comprises determining whether a signal is under compression.

16. The method of claim 15, wherein, for each period of time,
when it is determined that the signal is under compression, the estimated resistance is determined to be the difference between the estimated resistance for an immediately previous period of time and a second amount of resistance, and when it determined that the signal is not under compression, the estimated resistance is determined to be the estimated resistance for an immediately previous period of time.

17. The method of claim 8, wherein, for each period of time, the output current is calculated to be the difference between the output voltage and a clipping voltage threshold divided by the estimated resistance.

18. The method of claim 8, further comprising:

filtering an input audio signal to compensate for capacitive ripple.

\* \* \* \* \*